(12) United States Patent
Ratchkov

(10) Patent No.: US 6,674,176 B2
(45) Date of Patent: Jan. 6, 2004

(54) WIRE BOND PACKAGE WITH CORE RING FORMED OVER I/O CELLS

(75) Inventor: Radoslav Ratchkov, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/082,027

(22) Filed: Feb. 20, 2002

(65) Prior Publication Data

US 2003/0155633 A1 Aug. 21, 2003

(51) Int. Cl.[7] ............... H01L 23/48; H01L 23/52; H01L 29/40
(52) U.S. Cl. ............... 257/784; 257/774; 257/776
(58) Field of Search .................. 257/784, 774, 257/776

(56) References Cited

U.S. PATENT DOCUMENTS

| | | |
|---|---|---|
| 4,920,398 A | 4/1990 | Yoshio et al. |
| 5,311,058 A | 5/1994 | Smolley |
| 5,721,151 A | 2/1998 | Padmanabhan et al. |
| 6,194,768 B1 | 2/2001 | Gardner et al. |
| 6,194,786 B1 * | 2/2001 | Orcutt .................. 257/780 |
| 6,476,497 B1 | 11/2002 | Waldron et al. |
| 6,483,714 B1 | 11/2002 | Jones |

OTHER PUBLICATIONS

U.S. patent application entitled "High Density Input Output" filed on Nov. 27, 2001 (pending)US Ser. No. 09/994,567; First named inventor: Anwar Ali.
US 2002/0056857 –Author(s) –Yoshiro Iwasa May 16, 2002 09/984,219 United States Patent Application Publication.

* cited by examiner

Primary Examiner—Amir Zarabian
Assistant Examiner—Kiesha Rose
(74) Attorney, Agent, or Firm—Fitch, Even, Tabin & Flannery

(57) ABSTRACT

A wire bond package for an integrated circuit die includes a first I/O core ring and a second I/O core ring formed in a first metal layer; a pad strap formed in a second metal layer overlapping the second I/O core ring; a via formed between the first metal layer and the second metal layer where the second I/O core ring and the pad strap overlap; a first core ring formed in a third metal layer overlapping the first I/O core ring; a via formed between the first metal layer and the third metal layer where the first I/O core ring and the first core ring overlap outside the power strap; a first power mesh formed in a fourth metal layer overlapping the first core ring; and a via formed between the third metal layer and the fourth metal layer where the first core ring and the first power mesh overlap.

11 Claims, 4 Drawing Sheets

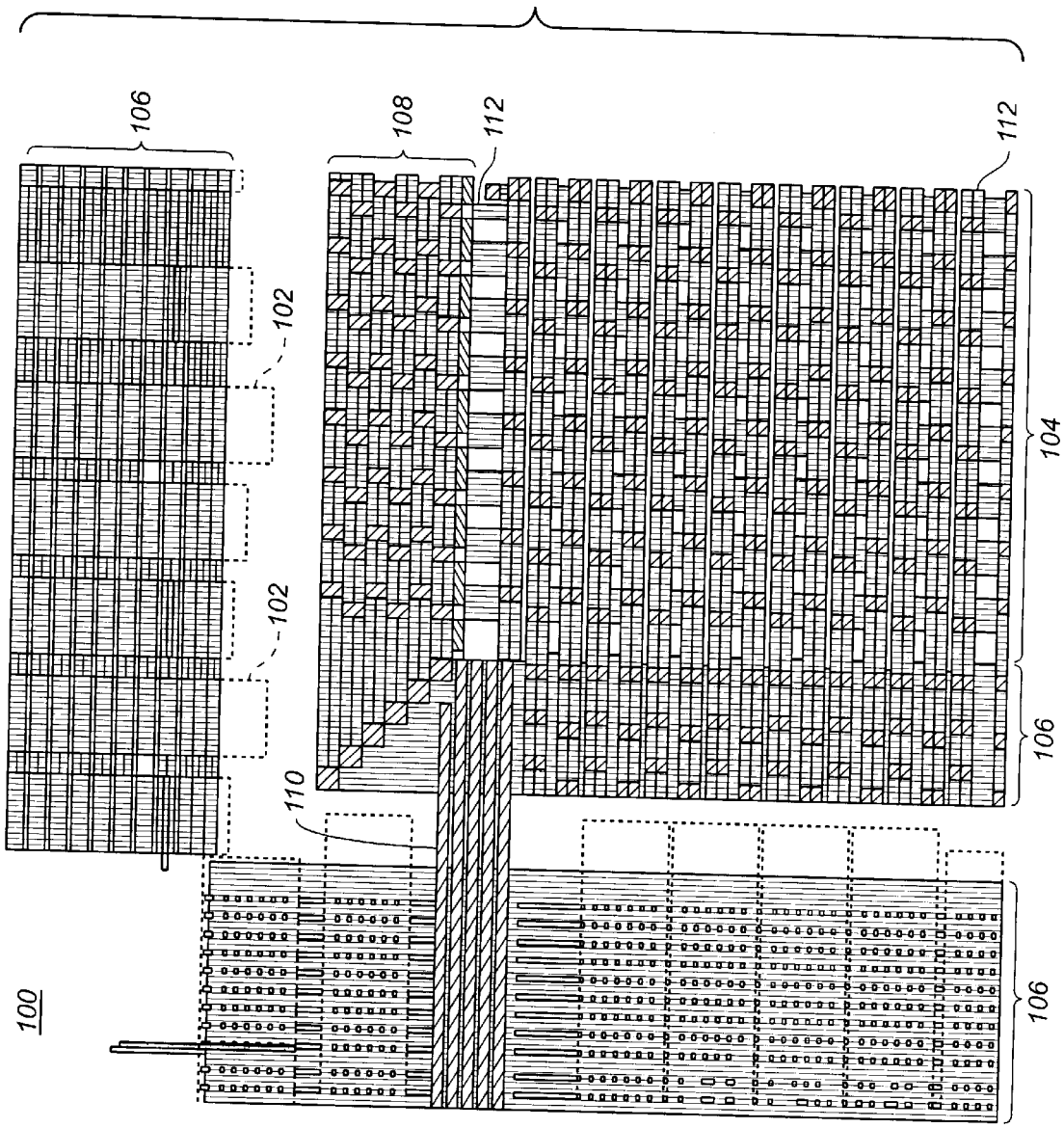
FIG._1
(PRIOR ART)

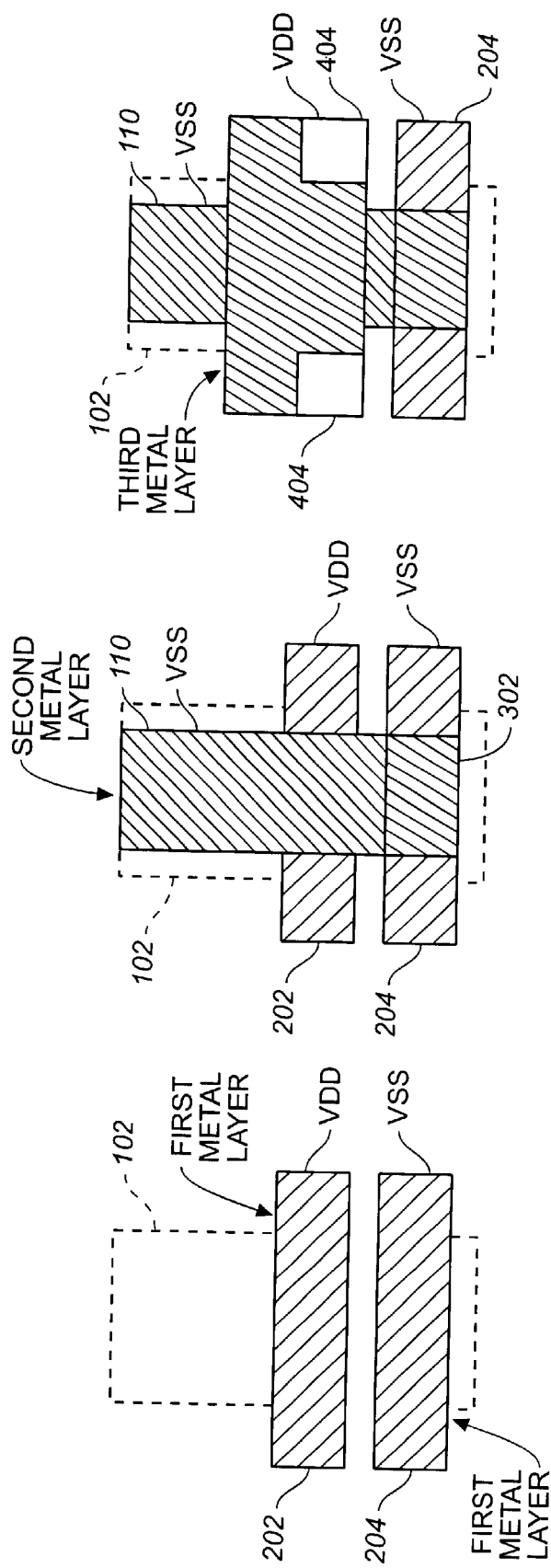

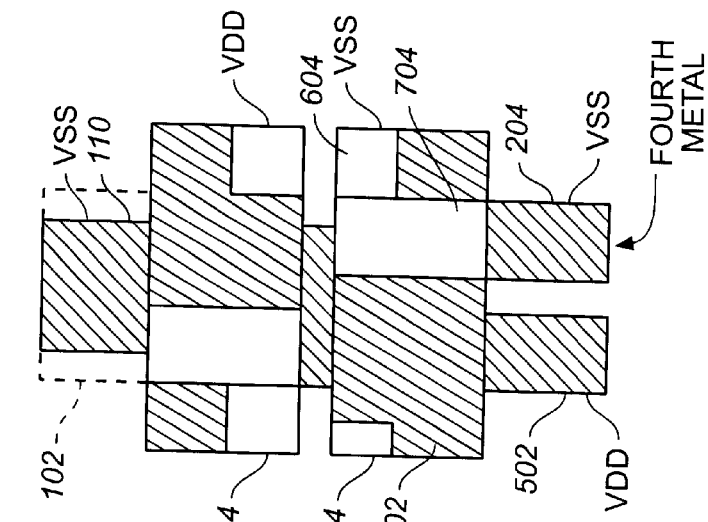
FIG._7
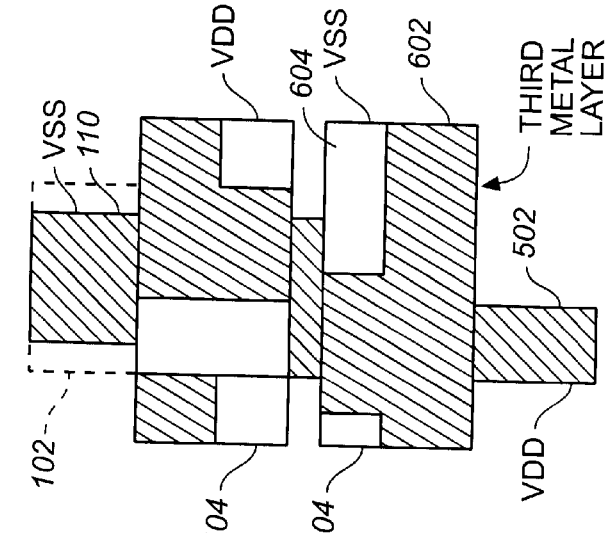
FIG._6
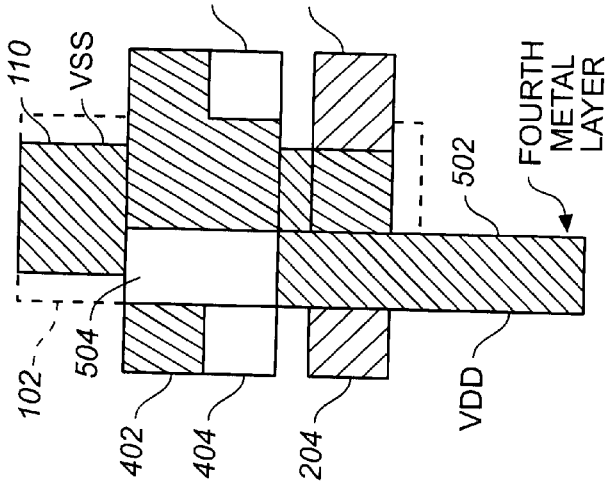
FIG._5

WIRE BOND PACKAGE WITH CORE RING FORMED OVER I/O CELLS

FIELD OF THE INVENTION

The present invention relates generally to methods of manufacturing integrated circuits. More specifically, but without limitation thereto, the present invention relates to methods for reducing the die size in an integrated circuit.

BACKGROUND OF THE INVENTION

In previous wire bond package designs, a core ring is formed in a metal layer over an integrated circuit chip (or die) in an area defined between input/output (I/O) cells arranged along the periphery of the die and standard cells arranged in the center of the die. A core ring is a rectilinearly shaped wire conductor in the wire bond package that surrounds the center of the die. Core rings are generally formed as a pair of parallel wires. Typically, one wire conducts power (VDD) and the other wire conducts ground (VSS). Core rings are used for connecting the standard cells to power and ground by straps that connect the core rings to the edge of the wire bond package and by power meshes that cross over the die between identical core rings on opposite sides of the die.

SUMMARY OF THE INVENTION

In one aspect of the present invention, core rings are formed over the I/O core rings that overlap the I/O cells of an integrated circuit die, thereby reducing the space between the I/O cells and the standard cells, advantageously decreasing the required die size. In one embodiment, a wire bond package includes a first I/O core ring and a second I/O core ring formed in a first metal layer; a pad strap formed in a second metal layer to overlap the second I/O core ring; a via formed between the first metal layer and the second metal layer where the second I/O core ring and the pad strap overlap; a first core ring formed in a third metal layer overlapping the first I/O core ring; a via formed between the first metal layer and the third metal layer where the first I/O core ring and the first core ring overlap outside the pad strap; a first power mesh formed in a fourth metal layer overlapping the first core ring; and a via formed between the third metal layer and the fourth metal layer where the first core ring and the first power mesh overlap.

In another embodiment, method of forming a core ring in a wire bond package includes forming a first I/O core ring and a second I/O core ring in a first metal layer; forming a pad strap in a second metal layer overlapping the second I/O core ring; forming a via between the first metal layer and the second metal layer where the second I/O core ring and the pad strap overlap; forming a first core ring in a third metal layer to overlap the first I/O core ring; forming a via between the first metal layer and the third metal layer where the first I/O core ring and the first core ring overlap outside the pad strap; forming a first power mesh in a fourth metal layer overlapping the first core ring; and forming a via between the the third metal layer and the fourth metal layer where the first core ring and the first power mesh overlap.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates the upper left quadrant of a wire bond package of the prior art;

FIGS. 2, 3, 4, 5, 6, and 7 illustrate the formation of core rings and power meshes for a wire bond package in accordance with an embodiment of the present invention.

Figure 8:
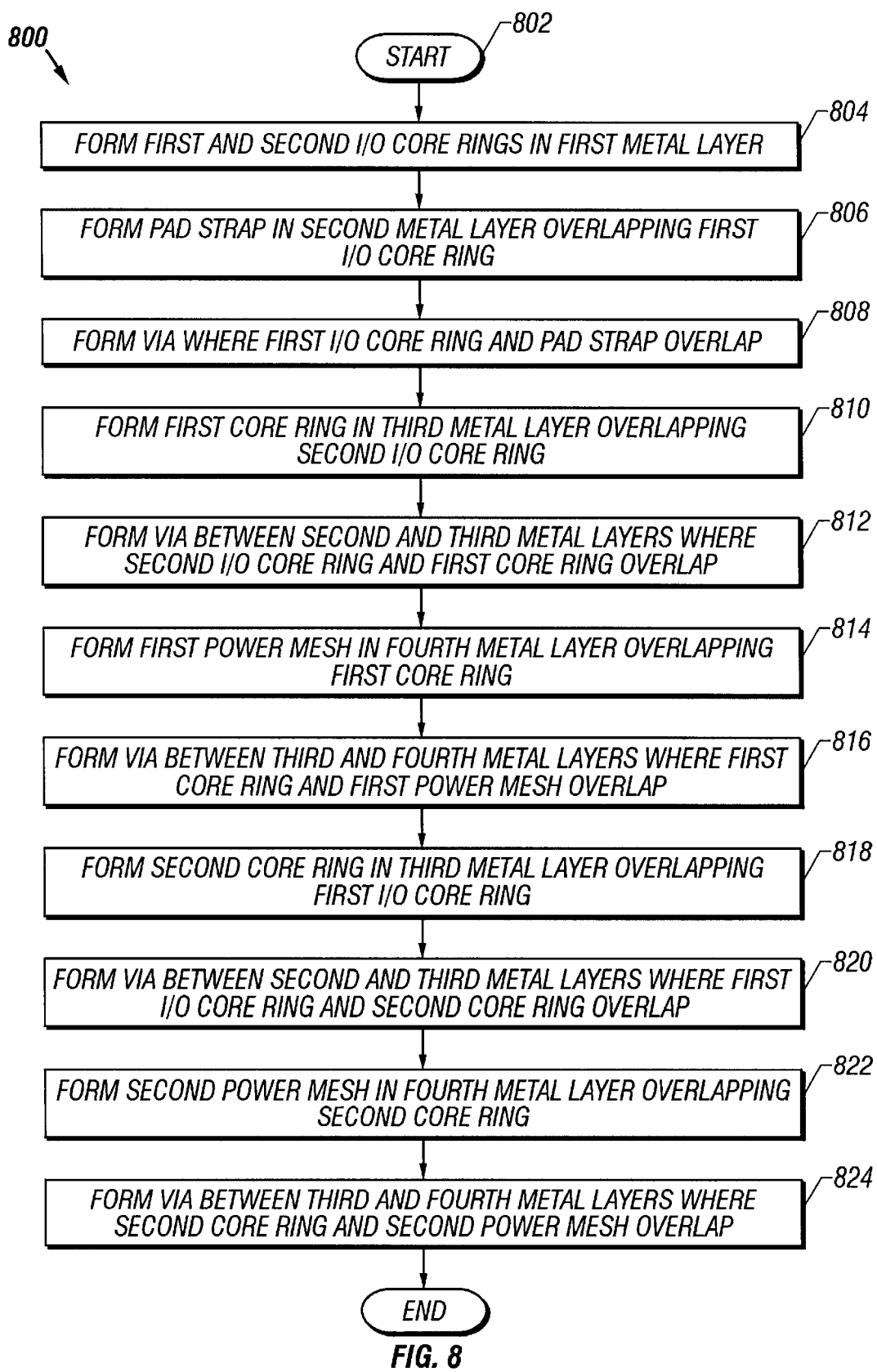
FIG. 8 illustrates a flow chart of the steps performed in the formation of core rings and power meshes for a wire bond package illustrated in FIGS. 2, 3, 4, 5, 6, and 7.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

FIG. 1 illustrates the upper left quadrant of a wire bond package and die 100 of the prior art. Shown in FIG. 1 are I/O cells 102, standard cells 104, I/O core rings 106, core rings 108, pad straps 110, and power meshes 112.

As shown in FIG. 1, the core rings 108 are formed in an area over the die defined between the I/O cells 102 and the standard cells 104. The I/O core rings 106 are used for connecting the I/O cells 102 to power (VDD) and ground (VSS). Likewise, the core rings 108 are used for connecting the standard cells 104 to power (VDD) and ground (VSS) by the pad straps 110 and the power meshes 112. The pad straps 110 connect the core rings 108 to the outside edges of the wire bond package. The power meshes 112 are wires that connect the core rings 108 to the standard cells 104. The power meshes 112 are routed over the standard cells 104 between the core rings 108 on opposite sides (not shown) of the die. The I/O core rings 106, the core rings 108, the pad straps 110, and the power meshes 112 are typically formed in separate, electrically conductive metal layers of the wire bond package.

The metal layers are generally electrically insulated from one another except for vias formed between the metal layers that connect wires formed in one metal layer with wires formed in another metal layer. The metal layers used for the horizontal core rings at the top and bottom of the wire bond package 100 are typically even-numbered metal layers, while the metal layers used for the vertical core rings at the sides of the wire bond package 100 are typically odd-numbered metal layers, however other schemes for assigning actual metal layers may be used in various technologies to suit specific applications. To simplify the description, the metal layers referred to herein are referred to as the first metal layer, the second metal layer, the third metal layer, and the fourth metal layer, respectively. The actual physical numbering of the metal layers may be mapped from the relative numbering appropriately. For example, the first metal layer may be mapped to M2, the second metal layer to M3, the third metal layer to M4, and the fourth metal layer to M5.

A disadvantage of the arrangement in FIG. 1 is that the area of the die underneath the core rings is not used. As a result, the size of the die must be increased beyond that required by the I/O cells and the standard cells to accommodate the area required by the core rings. The increased die size results disadvantageously in a correspondingly higher cost.

In one aspect of the present invention, the core rings overlap the I/O core rings over the I/O cells so that the space between the I/O cells and the standard cells may be reduced, thereby decreasing the die size. In one embodiment, an integrated circuit die includes a first I/O core ring and a second I/O core ring formed in a first metal layer wherein the first I/O core ring and the second I/O core ring overlap an I/O cell of the integrated circuit die; a pad strap formed in a second metal layer overlapping the first I/O core ring; a via formed between the first metal layer and the second metal layer where the first I/O core ring and the pad strap overlap; a first core ring formed in a third metal layer overlapping the second I/O core ring; a via formed between the second metal layer and the third metal layer where the second I/O core ring and the first core ring overlap; a first power mesh formed in a fourth metal layer to overlap the first core ring; and a via formed between the third metal layer and the fourth metal layer where the first core ring and the first power mesh overlap.

FIGS. 2, 3, 4, 5, 6, and 7 illustrate the formation of core rings and power meshes for a wire bond package in accordance with an embodiment of the present invention.

In FIG. 2, a first I/O core ring 202 and a second core ring 204 are formed in the first metal layer extending generally parallel to each other overlapping an I/O cell 102 according to standard techniques. A typical width for the I/O core rings 202 and 204 is about five microns.

In FIG. 3, a pad strap 110 is formed in the second metal layer generally perpendicular to the I/O core rings 202 and 204. The pad strap 110 overlaps the second I/O core ring 204 and is connected to the second I/O core ring 204 by a via 302. The via 302 is formed between the first metal layer and the second metal layer in the area where the pad strap 110 and the second I/O core ring 204 overlap.

In FIG. 4, a first core ring 402 is formed in a third metal layer overlapping the first I/O core ring 202. A typical width for the first core ring 402 is about 25 microns. The first core ring 402 is connected to the first I/O core ring 202 by vias 404 formed between the first metal layer and the third metal layer where the first core ring 402 overlaps the first I/O core ring 202 outside the pad strap 110. By forming the pad strap 110 before forming the first core ring 402, a collision is avoided between the pad strap 110 and the vias 404 in the area where the first I/O core ring 202 and the first core ring 402 overlap.

In FIG. 5, a first power mesh 502 is formed in a fourth metal layer. The first power mesh 502 overlaps the first core ring 402 and extends generally perpendicularly from the first core ring 402 to a corresponding core ring (not shown) on the opposite side of the wire bond package 100. The first power mesh 502 is connected to the first core ring 402 by a via 504 formed between the third metal layer and the fourth metal layer in the area where the first power mesh 502 and the first core ring 402 overlap.

In FIG. 6, a second core ring 602 overlapping the second I/O core ring 204 is formed in the third metal layer. A typical width for the second core ring 602 is about 25 microns. The second core ring 602 is connected to the second I/O core ring 204 by a via 604 formed between the first metal layer and the third metal layer where the second core ring 602 overlaps the second I/O core ring 204 outside the first power mesh 502.

In FIG. 7, a second power mesh 702 is formed in the fourth metal layer. The second power mesh 702 overlaps the second core ring 602 and extends generally perpendicularly from the second core ring 602 to an identical core ring (not shown) on the opposite side of the wire bond package 100. The second power mesh 702 is connected to the second core ring 602 by a via 704 formed between the third metal layer and the fourth metal layer in the area where the second power mesh 702 and the second core ring 602 overlap. The first core ring 402 and the first power mesh 502 are formed before the second core ring 602 and the second power mesh 702 to avoid the problem of power mesh wires colliding with the vias connecting the core rings to the I/O core rings when the power mesh wires are formed.

In the arrangement of FIG. 7, the I/O cells 102 may be placed closer to the standard cells 104 than is possible in the arrangement of FIG. 1, thereby reducing the required die size. The orientation of FIG. 7 illustrates forming core rings and power meshes at the top of the wire bond package 100. However, the formation of core rings and power meshes at the bottom of the wire bond package may be illustrated simply by rotating FIGS. 2, 3, 4, 5, 6, and 7 by 180 degrees. Likewise, the core rings and power meshes formed at the sides of the wire bond package 100 may be illustrated by rotating FIGS. 2, 3, 4, 5, 6, and 7 by 90 degrees or 270 degrees, respectively. The reversal of horizontal and vertical directions resulting from the rotation by 90 degrees or 270 degrees may also require reassigning of the relative metal layers to the actual metal layers. For example, if the first metal layer is assigned to the M2 metal layer in FIG. 2, then the first metal layer may be mapped to, for example, the M1 metal layer when FIG. 2 is rotated to illustrate forming the core rings and power meshes at the sides of the wire bond package 100.

In another embodiment, a method of forming a core ring in a wire bond package over an I/O cell of an integrated circuit die includes forming a first I/O core ring and a second I/O core ring in a first metal layer wherein the first I/O core ring and the second I/O core ring overlap an I/O cell of the integrated circuit die; forming a pad strap in a second metal layer overlapping the second I/O core ring; forming a via between the first metal layer and the second metal layer where the second I/O core ring and the pad strap overlap; forming a first core ring in a third metal layer overlapping the first I/O core ring; forming a via between the first metal layer and the third metal layer where the first I/O core ring and the first core ring overlap; forming a first power mesh in a fourth metal layer overlapping the first core ring; and forming a via between the third metal layer and the fourth metal layer where the first core ring and the first power mesh overlap.

FIG. 8 illustrates a flow chart of the steps performed in the formation of core rings and power meshes for a wire bond package illustrated in FIGS. 2, 3, 4, 5, 6, and 7.

Step 802 is the entry point of the flow chart 800.

In step 804, the first I/O core ring and the second I/O core ring are formed in the first metal layer overlapping an I/O cell (see FIG. 2).

In step 806, the pad strap is formed in the second metal layer overlapping the second I/O core ring (see FIG. 3).

In step 808, a via is formed between the first metal layer and the second metal layer where the second I/O core ring and the pad strap overlap (see FIG. 3).

In step 810, the first core ring is formed in the third metal layer overlapping the first I/O core ring (see FIG. 4).

In step 812, a via is formed between the first metal layer and the third metal layer where the first I/O core ring and the first core ring overlap outside the power strap (see FIG. 4).

In step 814, the first power mesh is formed in the fourth metal layer overlapping the first core ring (see FIG. 5).

In step 816, a via is formed between the third metal layer and the fourth metal layer where the first core ring and the first power mesh overlap (see FIG. 5).

In step 818, a second core ring is formed in the third metal layer overlapping the second I/O core ring (see FIG. 6).

In step 820, a via is formed between the first metal layer and the third metal layer where the second I/O core ring and the second core ring overlap outside the first power mesh (see FIG. 6).

In step 822, a second power mesh is formed in the fourth metal layer overlapping the second core ring (see FIG. 7).

In step 824, a via is formed between the third metal layer and the fourth metal layer where the second core ring and the second power mesh overlap (see FIG. 7).

Step 826 is the exit point for the flow chart 800.

Because there are no core rings in the area between the I/O cells 102 and the standard cells 104, the die size may be reduced accordingly, resulting advantageously in a correspondingly lower die cost.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A wire bond package for an integrated circuit die comprising:
    a first I/O core ring and a second I/O core ring formed of a first metal layer of the wire bond package;
    a pad strap formed of a second metal layer of the wire bond package overlapping the second I/O core ring;
    a first via connecting the first metal layer and the second metal layer where the second I/O core ring and the pad strap overlap;
    a first core ring formed of a third metal layer of the wire bond package overlapping the first I/O core ring;
    a second via connecting the first metal layer and the third metal layer where the first I/O core ring and the first core ring overlap outside the power strap;
    a first power mesh formed of a fourth metal layer of the wire bond package overlapping the first core ring; and
    a third via connecting the third metal layer and the fourth metal layer where the first core ring and the first power mesh overlap.

2. The wire bond package of claim 1 further comprising a second core ring formed of the third metal layer overlapping the second I/O core ring.

3. The wire bond package of claim 2 further comprising a fourth via connecting the first metal layer and the first metal layer and the third metal layer where the second I/O core ring and the second core ring overlap outside the first power mesh.

4. The wire bond package of claim 3 further comprising a second power mesh formed of the fourth metal layer overlapping the second core ring.

5. The wire bond package of claim 4 further comprising a fifth via connecting the third metal layer and the fourth metal layer where the second core ring and the second power mesh overlap.

6. A wire bond package for an integrated circuit die comprising:
    a first I/O core ring and a second I/O core ring formed of a first metal layer of the wire bond package wherein the first I/O core ring and the second I/O core ring overlap an I/O cell of the integrated circuit die;
    a pad strap formed of a second metal layer of the wire bond package wherein the pad strap overlaps the second I/O ring;
    a first via connecting the first metal layer and the second metal layer where the second I/O core ring and the pad strap overlap;
    a first core ring formed of a third metal layer of the wire bond package wherein the first core ring overlaps the first I/O core ring;
    a second via connecting the first metal layer and the third metal layer where the first I/O core ring and the first core ring overlap outside the power strap to avoid collision between the pad strap and the second via;
    a first power mesh formed of a fourth metal layer of the wire bond package wherein the first power mesh overlaps the I/O core ring; and
    a third via connecting the third metal layer and the fourth metal layer where the first core ring and the first power mesh overlap.

7. The wire bond package of claim 6 further comprising a second core ring formed of the third metal layer wherein the second core ring overlaps the second I/O core ring.

8. The wire bond package of claim 7 further comprising a fourth via connecting the first metal layer and the third metal layer wherein the second I/O core ring and the second core ring overlap outside the first power mesh.

9. The wire bond package of claim 8 further comprising a second power mesh formed of the fourth metal layer overlapping the second core ring.

10. The wire bond package of claim 9 further comprising a fifth via connecting the third metal layer and the fourth metal layer where the second core ring and the second power mesh overlap.

11. The wire bond package of claim 9 wherein the first core ring and the first power mesh are formed before the second core ring to avoid collision between the second via and the fourth via.

* * * * *